US009502136B1

(12) United States Patent
Kim

(10) Patent No.: US 9,502,136 B1
(45) Date of Patent: Nov. 22, 2016

(54) SEMICONDUCTOR MEMORY AND MEMORY SYSTEM USING THE SAME

(71) Applicant: SK hynix Inc., Icheon-si Gyeonggi-do (KR)

(72) Inventor: Kwan Weon Kim, Icheon-si (KR)

(73) Assignee: SK HYNIX INC., Icheon-Si (KR)

( * ) Notice: Subject to any disclaimer, the term of this patent is extended or adjusted under 35 U.S.C. 154(b) by 0 days.

(21) Appl. No.: 15/015,743

(22) Filed: Feb. 4, 2016

(30) Foreign Application Priority Data

Sep. 17, 2015 (KR) ........................ 10-2015-0131399

(51) Int. Cl.

| | |
|---|---|
| ***G11C 7/00*** | (2006.01) |
| ***G11C 29/12*** | (2006.01) |
| ***G11C 7/10*** | (2006.01) |
| ***G11C 7/22*** | (2006.01) |

(52) U.S. Cl.
CPC ................ *G11C 29/12* (2013.01); *G11C 7/10* (2013.01); *G11C 7/22* (2013.01)

(58) Field of Classification Search
CPC ... G11C 29/00; G11C 29/0469; G11C 29/12; G11C 29/14
USPC ........................ 365/200, 230.1, 230.05, 219
See application file for complete search history.

(56) References Cited

U.S. PATENT DOCUMENTS

| | | | | |
|---|---|---|---|---|
| 2008/0164894 A1 | 7/2008 | Kim et al. | | |
| 2009/0138768 A1* | 5/2009 | Pyeon | G11C 29/025 | 714/715 |
| 2011/0004793 A1* | 1/2011 | Sul | G11C 29/003 | 714/718 |
| 2014/0006863 A1* | 1/2014 | Yang | G11C 29/10 | 714/30 |

* cited by examiner

*Primary Examiner* — Han Yang
(74) *Attorney, Agent, or Firm* — William Park & Associates Ltd.

(57) ABSTRACT

A semiconductor memory includes a memory block configured to perform an operation according to a first test pattern or a second test pattern, a switching circuit configured to provide the first test pattern or the second test pattern to the memory block according to a first test mode signal and a second test mode signal, and a test pattern setup circuit configured to store a test pattern source signal in a feedback loop varied according to a third test mode signal and output the stored test pattern source signal as the first test pattern.

21 Claims, 6 Drawing Sheets

100
ADD
CMD
CLK
CS_0, RST_b0
CS_1, RST_b1
CS_2, RST_b2
CS_3, RST_b3
101
SEMICONDUCTOR CHIP (CH 0)
102
SEMICONDUCTOR CHIP (CH 1)
103
SEMICONDUCTOR CHIP (CH 2)
104
SEMICONDUCTOR CHIP (CH 3)
DQ
DQ
DQ
DQ
PKG 101
500
300
200
MEMORY
TM_PTN
iCMD
iADD
iCS_0
601
602
603
301
302
303
FIRST PROGRAMMABLE PIPE LATCH
SECOND PROGRAMMABLE PIPE LATCH
THIRD PROGRAMMABLE PIPE LATCH
TM<0:n>
501
502
503
TM_PGM
CMD
ADD
CS_0
CLK
RST_b0 iCMD
TM_PTN
601
315
Q
D
TM<n>
414
314
301
TM<2>
413
313
TM<1>
412
312
TM<0>
411
311
TM_PGM
501
CMD
CLK
RST_b0

SEMICONDUCTOR MEMORY AND MEMORY SYSTEM USING THE SAME

CROSS-REFERENCES TO RELATED APPLICATION

This application claims priority under 35 U.S.C. 119(a) to Korean application No. 10-2015-0131399, filed on Sep. 17, 2015, in the Korean intellectual property Office, which is incorporated by reference in its entirety as set forth in full.

BACKGROUND

1. Technical Field

The inventive concept relates to a semiconductor integrated circuit, and more particularly, to a semiconductor memory and a memory system using the same.

2. Related Art

Semiconductor apparatuses may be configured in a structure in which a plurality of semiconductor chips are two-dimensionally arranged or three-dimensionally stacked.

The plurality of semiconductor chips may be channels which use individual data input/output (I/O) pads. That is, the semiconductor apparatus may include a plurality of channels.

A test for verifying whether or not an operation of the semiconductor apparatus is normally performed may be inevitably performed.

However, since the number of channels which can be tested once in the test equipment is limited, the test equipment has to sequentially test the plurality of channels using the same test pattern regardless of an actual operation environment, and thus test versatility and test performance may be reduced.

SUMMARY

According to an embodiment, there is provided a semiconductor memory. The semiconductor memory may include a memory block configured to perform an operation according to a first test pattern or a second test pattern. The semiconductor memory may also include a switching circuit configured to provide the first test pattern or the second test pattern to the memory block according to a first test mode signal and a second test mode signal. The semiconductor memory may also include a test pattern setup circuit configured to store a test pattern source signal in a feedback loop varied according to a third test mode signal and output the stored test pattern source signal as the first test pattern.

According to an embodiment, there is provided a memory system. The memory system may include a plurality of channels. The memory system may be configured to operate remaining channels according to a first test pattern other than one channel among the plurality of channels, and allow the one channel to perform a test operation according to a second test pattern.

DETAILED DESCRIPTION

Figure 1:
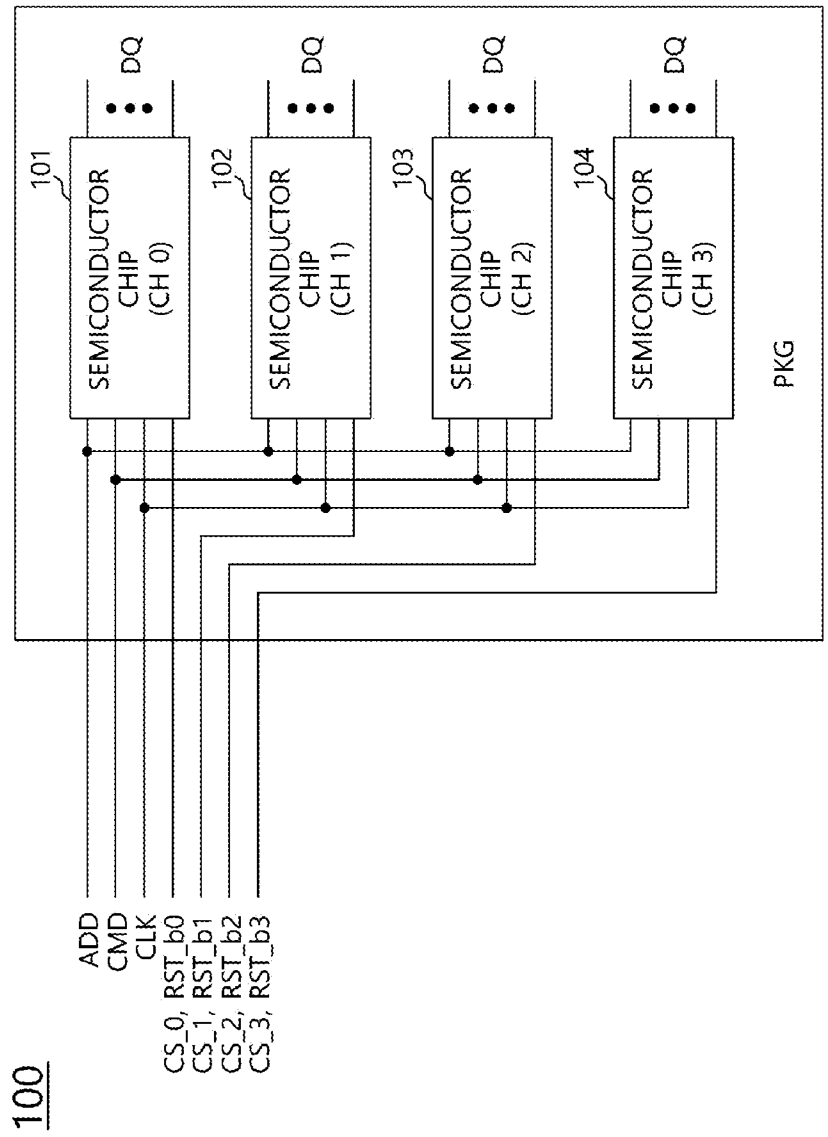
FIG. 1 is a view illustrating a configuration of a memory system according to an embodiment of the inventive concept.

Hereinafter, various embodiments will be described in greater detail with reference to the accompanying figures. Various embodiments are described herein with reference to cross-sectional illustrations that are schematic illustrations of embodiments (and intermediate structures). As such, variations from the shapes of the illustrations as a result, for example, of manufacturing techniques and/or tolerances, are to be expected. Thus, embodiments should not be construed as limited to the particular shapes of regions illustrated herein but may be to include deviations in shapes that result, for example, from manufacturing. In the figures, lengths and sizes of layers and regions may be exaggerated for clarity. Like reference numerals in the figures denote like elements. It is also understood that when a layer is referred to as being "on" another layer or substrate, it can be directly on the other or substrate, or intervening layers may also be present. One or more various embodiments are provided to a semiconductor memory and a memory system capable of improving test performance.

The inventive concept is described herein with reference to cross-section and/or plan illustrations that are schematic illustrations of idealized embodiments of the inventive concept. However, embodiments of the inventive concept should not be limited construed as limited to the inventive concept. Although a few embodiments of the inventive concept will be shown and described, it will be appreciated by those of ordinary skill in the art that changes may be made in these embodiments without departing from the principles and spirit of the inventive concept.

Referring to FIG. 1, a memory system 100 according to an embodiment of the inventive concept may include a plurality of semiconductor chips 101 to 104. In an embodiment, the plurality of semiconductor chips 101 to 104 may be provided in one package PKG which may be configured as a circuit. In an embodiment, the plurality of semiconductor chips 101 to 104 may be provided in two or more packages.

An address signal ADD, a command signal CMD, and a clock signal CLK may be commonly provided to the plurality of semiconductor chips 101 to 104.

Chip select signals CS_0 to CS_3 and reset signals RST_b0 to REST_b3 may be independently provided to the plurality of semiconductor chips 101 to 104, respectively.

Each of the plurality of semiconductor chips 101 to 104 may be activated through a chip select signal corresponding thereto among the chip select signals CS_0 to CS_3.

Each of the plurality of semiconductor chips 101 to 104 may be initialized by a reset signal corresponding thereto among the reset signals RST_b0 to RST_b3.

The plurality of semiconductor chips 101 to 104 may receive the command signal CMD, the address signal ADD, the clock signal CLK, the chip select signals CS_0 to CS_3, and the reset signals RST_b0 to REST_b3 from an external apparatus. The external apparatus may be for example, a controller such as a central processing unit (CPU) or a graphic processing unit (GPU).

The plurality of semiconductor chips 101 to 104 may include individual data input/output (I/O) terminals DQ and may be configured to perform independent operations. In an embodiment, each of the plurality of semiconductor chips 101 to 104 may correspond to one channel. In an embodiment, the plurality of semiconductor chips 101 to 104 may refer to first to fourth channels CH0 to CH3.

The first to fourth channels CH0 to CH3 may have the same configuration as each other.

In the memory system 100 according to an embodiment, the first to fourth channels CH0 to CH3 may be configured to be simultaneously operated using different test patterns.

The test pattern may be refer to a pattern that a combination of the command signal CMD, the address signal ADD, and the chip select signals CS_0 to CS_3 may be sequentially repeated the predetermined number of times.

The memory system 100 may be configured to store a first test pattern by previously programming different test patterns with respect to the first to fourth channels CH0 to CH3. The memory system 100 may also perform a test based on a second test pattern on a desired channel among the first to fourth channels CH0 to CH3. The memory system 100 may also repeatedly perform a dummy operation based on the first test pattern on the remaining channels while the test is performed.

The first test pattern may be not a test pattern for an actual test but a test pattern for the dummy operation. Further, the first test pattern may refer to a dummy test pattern. The second test pattern may be a test pattern for the actual test which is input from the outside of the memory system in real time. In addition, the second test pattern may refer to an external test pattern.

The reliability of the test on the memory system 100 may be increased as the test pattern is equally to the actual operation environment.

However, due to the physical limitation of the test equipment in the actual test environment, the test is performed on any one among the first to fourth channels CH0 to CH3 and any operation may be performed on the remaining channels.

Accordingly, the memory system 100 according to an embodiment may perform a test, which performs actual data I/O, on one channel among the first to fourth channels CH0 to CH3 by providing a test pattern to the one channel. The memory system 100 may also perform a dummy operation similar to the actual operation environment on the remaining channels using different dummy test patterns which are previously programmed. Further, a detailed description thereof will be made with reference to the accompanying figures below.

Figure 2:
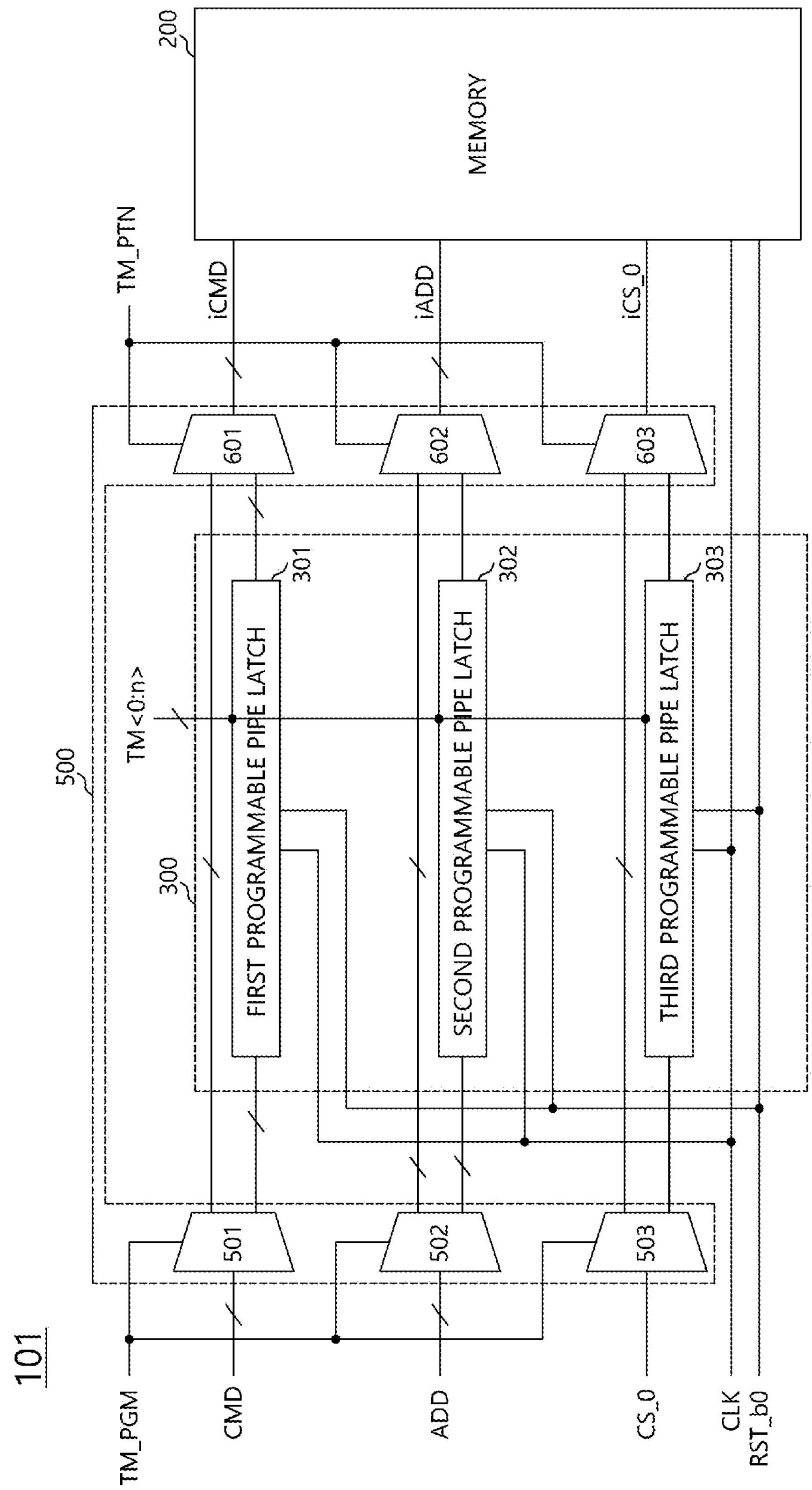
FIG. 2 is a view illustrating a configuration of a semiconductor chip of FIG. 1.

Referring to FIG. 2, the semiconductor chip 101, that is, the first channel CH0 may include a memory block 200, a test pattern setup unit 300, and a switching unit 500.

The memory block 200 may be configured to perform an operation, for example, a read operation, a write operation, a precharge operation, and the like according to a first test pattern (that is, the dummy test pattern) or the second test pattern (that is, the external test pattern).

An internal command signal iCMD, an internal address signal iADD, and an internal chip selection signal iCS_0 as the external test pattern or the dummy test pattern may be provided to the memory block 200.

The switching unit 500 may be configured to provide the external test pattern or the dummy test pattern to the memory block 200 according to a first test mode signal TM_PGM and a second test mode signal TM_PTN.

The switching unit 500 may include first to third demultiplexers 501 to 503 and first to third multiplexers 610 to 603.

The first to third demultiplexers 501 to 503 may output the command signal CMD, the address signal ADD, and the chip selection signal CS_0 as the test pattern source signal or the external test pattern according to the first test mode signal TM_PGM.

For example, when the first test mode signal TM_PGM is a high level, the first to third demultiplexers 501 to 503 may provide the command signal CMD, the address signal ADD, and the chip selection signal CS_0 as the test pattern source signal to the test pattern setup unit 300.

When the first test mode signal TM_PGM is a low level, the first to third demultiplexers 501 to 503 may provide the command signal CMD, the address signal ADD, and the chip selection signal CS_0 as the external test pattern to the first to third multiplexers 601 to 603.

The first demultiplexer 501 may provide the command signal CMD to the test pattern setup unit 300 when the first test mode signal TM_PGM is the high level. The first demultiplexer 501 may also provide the command signal CMD to the first multiplexer 601 when the first test mode signal TM_PGM is the low level.

The second demultiplexer 502 may provide the address signal ADD to the test pattern setup unit 300 when the first test mode signal TM_PGM is the high level. The second demultiplexer 502 may also provide the address signal ADD to the second multiplexer 602 when the first test mode signal TM_PGM is the low level.

The third demultiplexer 503 may provide the chip select signal CS_0 to the test pattern setup unit 300 when the first test mode signal TM_PGM is the high level. The third demultiplexer 503 may also provide the chip select signal CS_0 to the third multiplexer 603 when the first test mode signal TM_PGM is the low level.

The first to third multiplexers 601 to 603 may output the dummy test pattern or the external test pattern as the internal command signal iCMD, the internal address signal iADD, and the internal chip selection signal iCS_0 to the memory block 200 according to the second test mode signal TM_PTN.

For example, when the second test mode signal TM_PTN is a high level, the first to third multiplexers 601 to 603 may provide the dummy test pattern to the memory block 200.

When the second test mode signal TM_PTN is a low level, the first to third multiplexers 601 to 603 may provide the external test pattern. The external pattern may be outputs of the first to third demultiplexers 501 to 503 as the internal command signal iCMD, the internal address signal iADD, and the internal chip selection signal iCS_0 to the memory block 200.

The test pattern setup unit 300 may store the test pattern source signal, that is, the command signal CMD, the address signal ADD, and the chip select signal CS_0 provided through the first to third demultiplexers 501 to 503 therein. The test pattern setup unit 300 may also output the stored test pattern source signal as the dummy test pattern. In an embodiment, the test pattern setup unit 300 may be configure of a feedback loop varied according to a third test mode signal TM<0:n>, in which the test pattern source signal is stored. For example, the test pattern setup unit 300 may include first to third programmable pipe latches 301 to 303.

The first programmable pipe latch 301 may store the command signal CMD provided through the first demultiplexer 501 in the feedback loop varied according to the third test mode signal TM<0:n> and output the command signal CMD stored therein.

The second programmable pipe latch 302 may store the address signal ADD provided through the second demultiplexer 502 in the feedback loop varied according to the third test mode signal TM<0:n>. The second programmable pipe latch 302 may also output the address signal ADD stored therein.

The third programmable pipe latch 303 may store the chip select signal CS_0 provided through the third demultiplexer 503 in the feedback loop varied according to the third test mode signal TM<0:n> and output the chip select signal CS_0 stored therein.

The first to third programmable pipe latches 301 to 303 may be operated in synchronization with the clock signal CLK. Further, the internal storage values of the first to third programmable pipe latches 301 to 303 may be initialized according to the reset signal RST_b0.

The first to third programmable pipe latches 301 to 303 may have the same configuration as each other.

Figure 3:
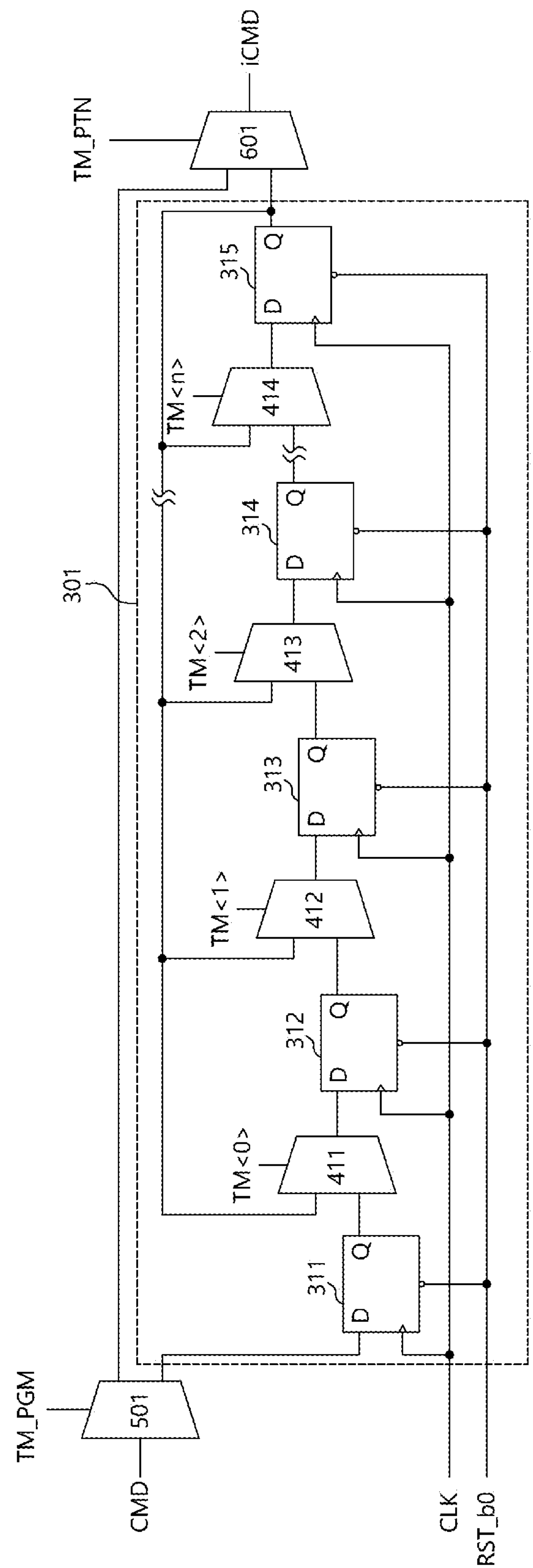
FIG. 3 is a view illustrating a configuration of a first test pattern setup circuit of FIG. 2.

Referring to FIG. 3, the first programmable pipe latch 301 may include a plurality of flip flops 311 to 315 and a plurality of multiplexers 411 to 414.

The plurality of flip flops 311 to 315 may sequentially shift input signals D thereof to next-stage flip flops according to the clock signal CLK.

Output values of the plurality of flip flops 311 to 315 may be initialized according to the reset signal RST_b0.

One of the plurality of multiplexers 411 to 414 selected according to signal bits of the third test mode signal TM<0:n> may feedback an output of a previous-stage flip flop 311 to 314 or an output of the final flip flop 315.

The plurality of multiplexers 411 to 414 may vary a length of the feedback loop, that is, the number of unit patterns included in the dummy test pattern according to the third test mode signal TM<0:n>.

Through adjusting of the value of the third test mode signal TM<0:n>, the dummy test patterns of the first to fourth channels CH0 to CH3 of FIG. 1 have the same value as each other or may have different values from each other.

For example, it may be assumed that the third test mode signal TM<0:n> includes 7 signal bits (n=6), TM<0> in the third test mode signal TM<0:n> is a high level and TM<1:n> is a low level. The first programmable pipe latch 301 may be configured of a seven-stage feedback loop (for clarity, loop_7) and generate the dummy test pattern in which 7 unit patterns are repeated.

Hereinafter, the dummy test pattern programming method will be described with reference to FIGS. 4 and 5 below.

The dummy test pattern programming may be simultaneously or selectively performed on the first to fourth channels CH0 to CH3 of FIG. 1.

One or a portion of the first to fourth channels CH0 to CH3 or all the first to fourth channels CH0 to CH3 may be selected using the chip select signals CS_0 to CS_3.

For example, a method of programming a dummy test pattern on the first channel CH0 will be described.

First, it may be assumed that the first channel CH0 is selected by activating the chip select signal CS_0, and TM<0> of the third test mode signal TM<0:n> is activated.

Figure 4:
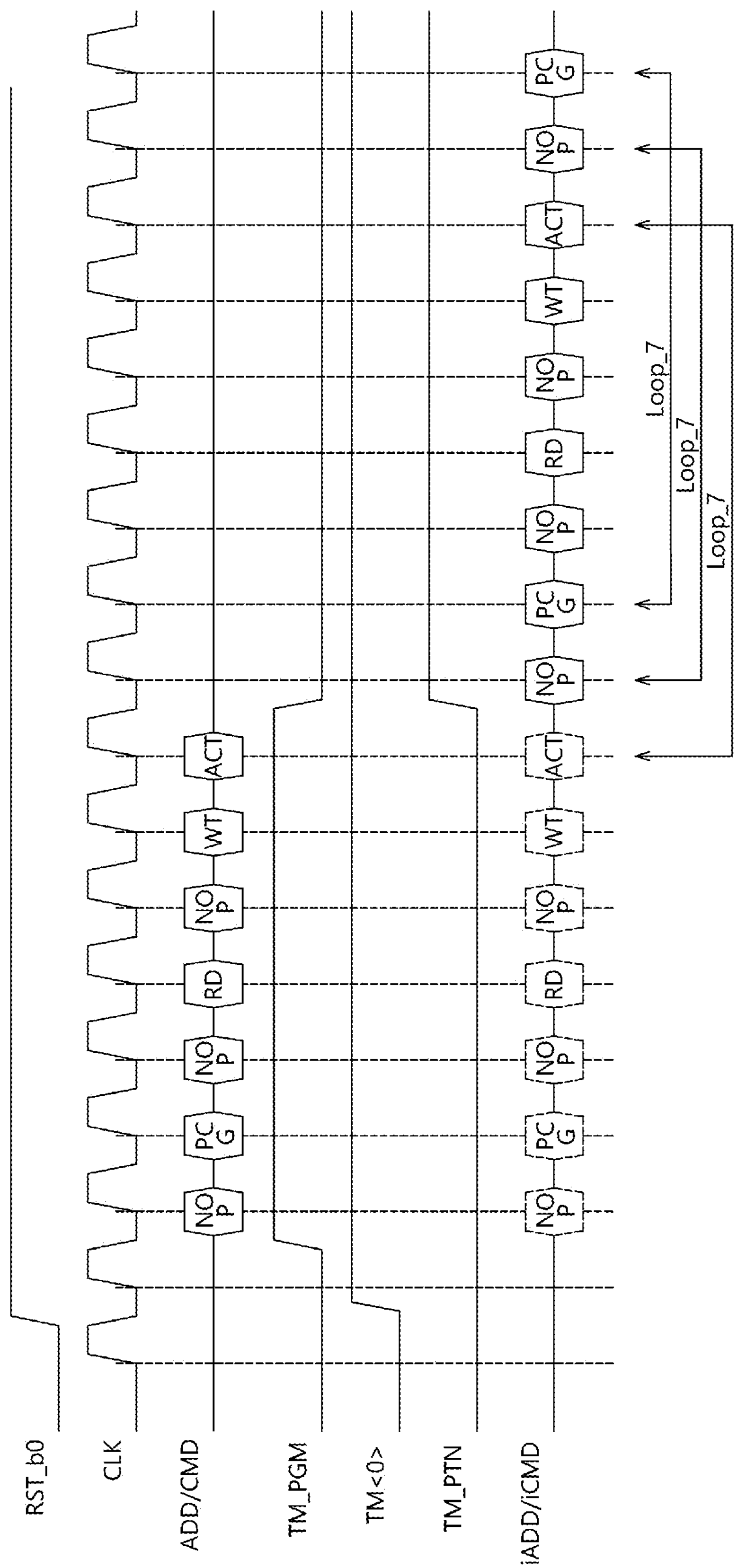
FIGS. 4 and 5 are timing diagrams explaining a dummy test pattern programming method according to an embodiment of the inventive concept.

In FIG. 4, the dummy test pattern value of the first channel CH0 may be initialized by the reset signal RST_b0.

In a state that the first test mode signal TM_PGM is set to the high level, a command signal and an address signal corresponding to the command signal ADD/CMD as the test pattern source signal may be sequentially input in order of NOP (No Operation), PCG (Precharge), NOP, RD (Read), NOP, WT (Write), and ACT (Active).

Since the TM<0> is in an activated state, the dummy test pattern configured of unit patterns, that is, NOP, PCG, NOP, RD, NOP, WT, and ACT may be stored in the seven-stage feedback loop (Loop_7) formed in the first programmable pipe latch 301 of FIG. 3. Accordingly, the dummy test pattern programming may be completed.

When the second test mode signal TM_PTN is transited to the high level, the unit patterns NOP, PCG, NOP, RD, NOP, WT and ACT of the dummy test pattern stored in the seven-stage feedback loop (Loop_7) may be repeatedly provided to the memory block 200 of FIG. 2 as the internal address signal and the internal command signal iADD/iCMD.

Accordingly, the first channel CH0 may repeatedly perform the dummy operation according to the dummy test pattern in which the seven unit patterns, that is, NOP, PCG, NOP, RD, NOP, WT, and ACT are repeated.

In another example, a method of programming a dummy test pattern, which is different from that of the first channel CH0, on the second channel CH1 will be described.

First, it may be assumed that the second channel CH1 is selected by activating the chip select signal CS_1, and TM<2> of the third test mode signal TM<0:n> is activated.

Figure 5:
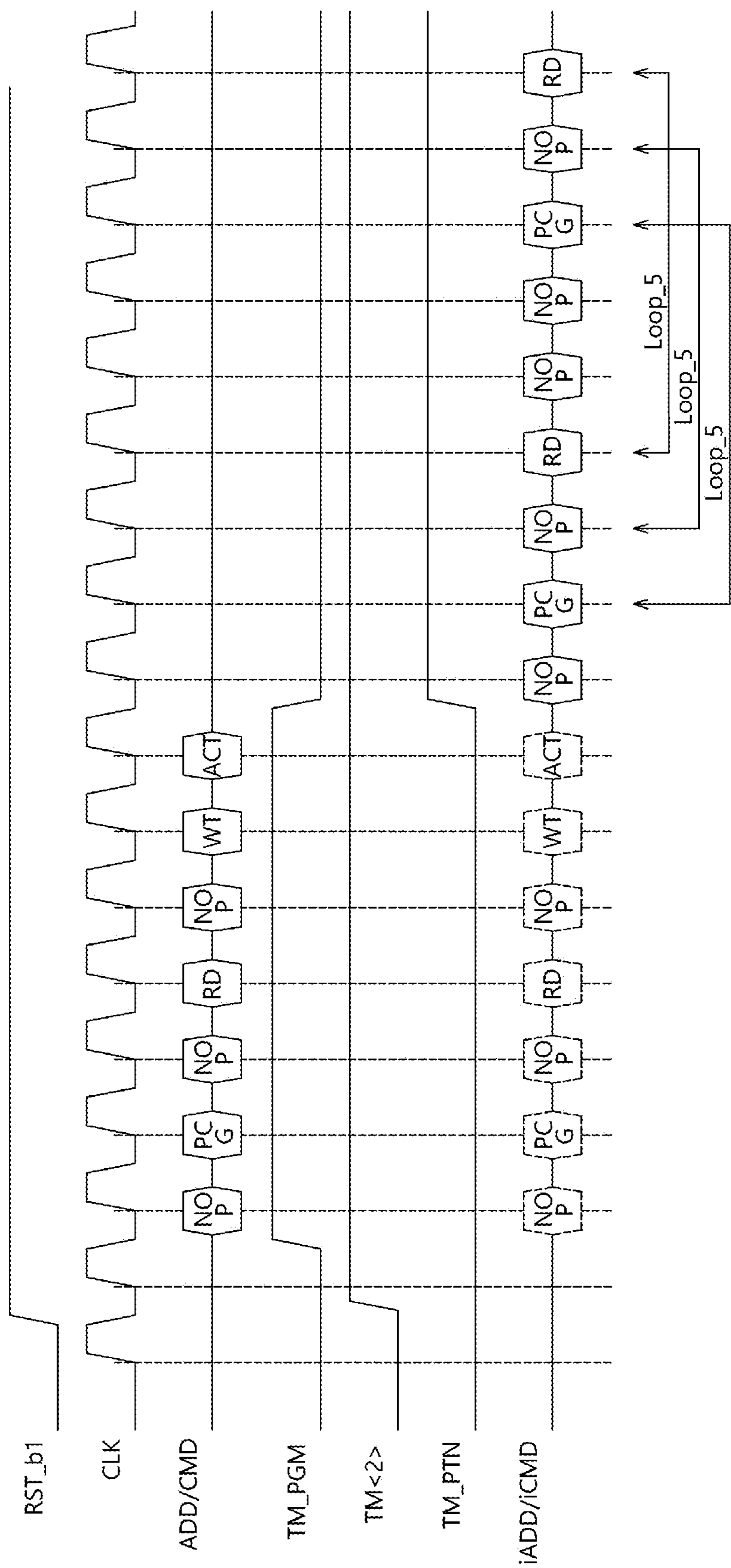

In FIG. 5, the dummy test pattern value of the second channel CH1 may be initialized by the reset signal RST_b1.

In a state that the first test mode signal TM_PGM is set to the high level, a command signal and an address signal corresponding to the command signal ADD/CMD as the test pattern source signal may be sequentially input in the same order as the first channel CH0, that is, in order of NOP, PCG, NOP, RD, NOP, WT, and ACT.

Since the TM<2> is in an activated state, five unit patterns, that is, NOP, PCG, NOP, RD, and NOP among the unit patterns NOP, PCG, NOP, RD, NOP, WT, and ACT of the dummy test pattern may be stored in the five-stage feedback loop (Loop_5) formed in the first programmable pipe latch 301 of FIG. 3. Accordingly, the dummy test pattern programming may be completed.

When the second test mode signal TM_PTN is transited to the high level, the unit patterns NOP, PCG, NOP, RD, and NOP of the dummy test pattern stored in the five feedback loop (Loop_5) may be repeatedly provided to the memory block 200 of FIG. 2 as the internal address signal and the internal command signal iADD/iCMD.

Accordingly, the second channel CH1 may repeatedly perform the dummy operation according to the dummy test pattern in which the five unit patterns, that is, NOP, PCG, NOP, RD, and NOP are repeated.

Figure 6:
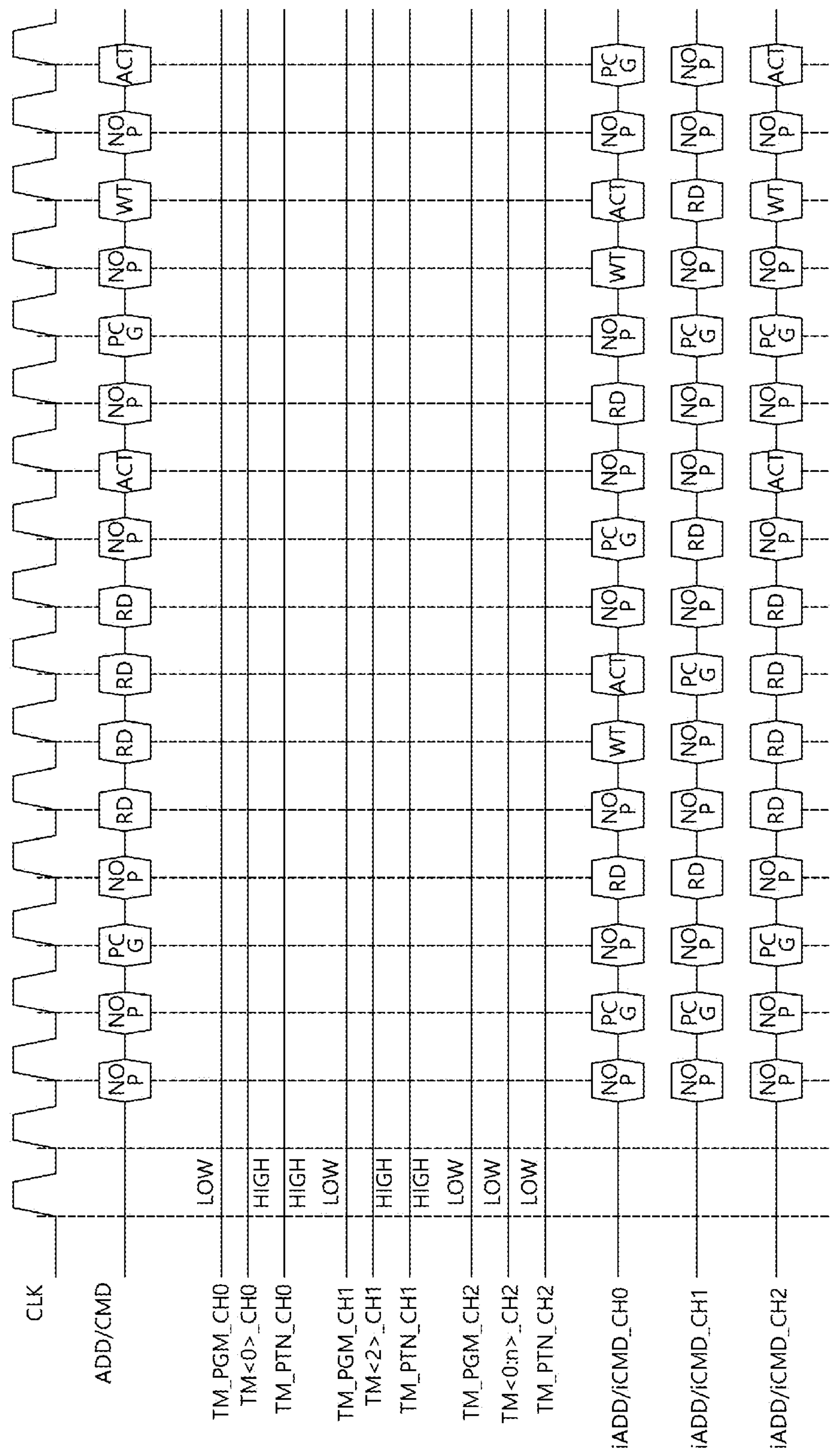
FIG. 6 is a timing diagram explaining a test method of a memory system according to an embodiment of the inventive concept.

Hereinafter, a method of performing a test on the third channel CH2 among the first to fourth channels CH0 to CH3 and performing a dummy operation on the remaining channels CH0, CH1, and Ch3 after the dummy test pattern programming is completed will be described with reference to FIG. 6.

It may be assumed that the same dummy test pattern programming as that described with reference to FIGS. 4 and 5 is performed on the first channel CH0 and the second channel CH1. Further, the dummy operation timing of the fourth channel CH3 will be omitted in FIG. 6.

Since the dummy test pattern programming is completed, all the first test mode signals TM_PGM_CH0 to TM_PGM_CH2 corresponding to the first to third channels CH0 to CH2 may be the low level. FIG. 6 also illustrates the internal address signal and internal command signal iADD/iCMD_CH0 to iADD/iCMD_CH2 corresponding to the first to third channels CH0 to CH2.

In a state that all the first test mode signals TM_PGM_CH0 to TM_PGM_CH2 are set to the low level, a command signal and an address signal corresponding to the command signal ADD/CMD as the external test pattern may be sequentially input in order of NOP, NOP, PCG, NOP, RD, RD, RD, RD, NOP, ACT, NOP, PCG, NOP, WT, NOP, and ACT.

Since the first channel CH0 and the second channel CH1 perform the dummy operation, the second test mode signals TM_PTN_CH0 and TM_PTN_CH1 corresponding to the first and second channels CH0 and CH1 are set to the high level. However, since the third channel CH2 performs the normal test operation, the second test mode signal TM_PTN_CH2 corresponding to the third channel CH2 may be set to the low level.

Accordingly, the first channel CH0 may repeatedly perform the dummy operation according to the dummy test pattern NOP, PCG, NOP, RD, NOP, WT, and ACT programmed as illustrated in FIG. 4; and simultaneously the second channel CH1 may repeatedly perform the dummy operation according to the dummy test pattern NOP, PCG, NOP, RD, and NOP programmed as illustrated in FIG. 5.

Since the second test mode signal TM_PTN_CH2 corresponding to the third channel CH2 is set to the low level, the third channel CH2 may not use the previously programmed dummy test pattern. Further, the third channel CH2 may perform the test operation according to the currently input external test pattern NOP, NOP, PCG, NOP, RD, RD, RD, RD, NOP, ACT, NOP, PCG, NOP, WT, NOP, and ACT, and perform actual data I/O according to the test operation.

Since the third channel CH2 perform the normal test operation, the dummy test pattern may be unnecessary. Further, the feedback loop operations of the first to third programmable pipe latches 301 to 303 of the test pattern setup unit 300 may be interrupted by setting all the signal bits of the third test mode signal TM<0:n> to the low level. Accordingly, current consumption may not occur.

As described above, the memory system 100 according to an embodiment may perform the dummy operation similar to the actual operation environment on the remaining channels using different dummy test patterns other than a channel which performs the normal test among the plurality of channels, and thus improve the versatility and reliability of the test.

The above embodiment of the invention is illustrative and not limitative. Various alternatives and equivalents are possible. The invention is not limited by the embodiment described herein. Nor is the invention limited to any specific type of semiconductor device. Other additions, subtractions, or modifications are obvious in view of the invention and are intended to fall within the scope of the appended claims.

What is claimed is:

1. A semiconductor memory comprising:

a memory block configured to perform an operation according to a first test pattern or a second test pattern;

a switching circuit configured to provide the first test pattern or the second test pattern to the memory block according to a first test mode signal and a second test mode signal; and a test pattern setup circuit configured to store a test pattern source signal in a feedback loop varied according to a third test mode signal and output the stored test pattern source signal as the first test pattern.

2. The semiconductor memory of claim 1, wherein the second test pattern includes a command signal input from a position outside of the semiconductor memory and an address signal corresponding to the command signal.

3. The semiconductor memory of claim 1, wherein the switching circuit includes:

a plurality of demultiplexers configured to output a command signal and an address signal as the test pattern source signal or the second test pattern according to the first test mode signal; and a plurality of multiplexers configured to provide the first test pattern or the second test pattern to the memory block according to the second test mode signal.

4. The semiconductor memory of claim 3, wherein the plurality of demultiplexers are configured to provide the first test pattern or the second test pattern as an internal command signal and an internal address signal to the memory block.

5. The semiconductor memory of claim 1, wherein the test pattern setup circuit includes a plurality of programmable pipe latches.

6. The semiconductor memory of claim 5, wherein each of the plurality of programmable pipe latches includes:

a plurality of flip flops configured to sequentially shift input signals thereof to next-stage flip flops according to a clock signal; and a plurality of multiplexers configured to output outputs of previous flip flops or a feedback output of a final flip flop among the plurality of flip flops according to signal bits of the third test mode signal.

7. A memory system comprising:

a plurality of channels, wherein the memory system is configured to operate remaining channels according to a first test pattern other than one channel among the plurality of channels, and allow the one channel to perform a test operation according to a second test pattern.

8. The memory system of claim 7, wherein the plurality of channels are a plurality of semiconductor chips having individual input/output (I/O) terminals.

9. The memory system of claim 7, wherein the plurality of channels are simultaneously operated according to the first test pattern or the second test pattern.

10. The memory system of claim 7, wherein the remaining channels are configured to be operated according to the first test pattern having different values.

11. The memory system of claim 7, wherein the remaining channels are configured to perform a dummy operation in which no data I/O is performed through data I/O terminals thereof.

12. The memory system of claim 7, wherein the remaining channels are configured to repeatedly perform operation sections according to the first test pattern having different values based on a clock signal.

13. The memory system of claim 7, wherein each of the plurality of channels includes:

a memory block configured to perform an operation according to the first test pattern or the second test pattern;

a switching circuit configured to provide the first test pattern or the second test pattern to the memory block according to a first test mode signal and a second test mode signal; and a test pattern setup circuit configured to store a test pattern source signal in a feedback loop varied according to a third test mode signal and output the stored test pattern source signal as the first test pattern.

14. The memory system of claim 13, wherein the second test pattern includes a command signal and an address signal which are currently input from an outside position of the memory system.

15. The memory system of claim 13, wherein the switching circuit includes:

a plurality of demultiplexers configured to output a command signal and an address signal as the test pattern source signal or the second test pattern according to the first test mode signal; and a plurality of multiplexers configured to provide the first test pattern or the second test pattern to the memory block according to the second test mode signal.

16. The memory system of claim 15, wherein the plurality of demultiplexers are configured to provide the first test pattern or the second test pattern as an internal command signal and an internal address signal to the memory block.

17. The memory system of claim 13, wherein the test pattern setup circuit includes a plurality of programmable pipe latches.

18. The memory system of claim 17, wherein each of the plurality of programmable pipe latches includes:

a plurality of flip flops configured to sequentially shift input signals thereof to next-stage flip flops according to a clock signal; and a plurality of multiplexers configured to output outputs of previous flip flops or a feedback output of a final flip flop among the plurality of flip flops according to signal bits of the third test mode signal.

19. The semiconductor memory of claim 1, wherein the memory block is configured to perform on operation according to a dummy test pattern or an external test pattern.

20. The semiconductor memory of claim 19, wherein the switching circuit is configured to provide the external test pattern or the dummy test pattern to the memory block.

21. The semiconductor memory of claim 1, wherein dummy test patterns of a plurality of channels have a same value or different values according to the third test mode signal.

* * * * *